(12) United States Patent
Park

(10) Patent No.: US 6,384,754 B1
(45) Date of Patent: May 7, 2002

(54) DECODER TESTING APPARATUS AND METHODS THAT SIMULTANEOUSLY APPLY THE SAME MULTIBIT INPUT DATA TO MULTIPLE DECODERS

(75) Inventor: Sang-ho Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/103,122

(22) Filed: Jun. 23, 1998

(30) Foreign Application Priority Data

Jun. 23, 1997 (KR) .............................. 97-26472

(51) Int. Cl.[7] .................. H03M 1/10; G01R 27/28; G01R 31/00
(52) U.S. Cl. .................. 341/120; 345/904; 702/118; 324/770
(58) Field of Search .................. 345/904, 98; 702/118; 365/230.06; 324/770, 158.1; 714/699, 712, 724, 742; 341/120

(56) References Cited

U.S. PATENT DOCUMENTS

| | | | | |
|---|---|---|---|---|
| 4,369,432 A | * | 1/1983 | Mikami | 386/113 |
| 4,538,266 A | * | 8/1985 | Miki | 341/118 |
| 4,672,610 A | * | 6/1987 | Salick | 371/27 |
| 4,761,607 A | * | 8/1988 | Shiragasawa et al. | 324/158 R |
| 4,958,155 A | * | 9/1990 | Gulczynski | 341/120 |
| 5,060,198 A | * | 10/1991 | Kowalski | 365/185.12 |
| 5,072,178 A | * | 12/1991 | Matsumoto | 324/158 R |
| 5,206,633 A | * | 4/1993 | Zalph | 345/92 |
| 5,245,326 A | * | 9/1993 | Zalph | 345/92 |
| 5,384,784 A | * | 1/1995 | Mori et al. | 341/152 |
| 5,406,566 A | * | 4/1995 | Obara | 374/21.2 |
| 5,453,991 A | * | 9/1995 | Suzuki et al. | 371/22.1 |
| 5,473,619 A | | 12/1995 | Sakaguchi | 371/25.1 |
| 5,483,237 A | * | 1/1996 | Guzinski | 341/120 |
| 5,583,502 A | * | 12/1996 | Takeuchi et al. | 341/120 |
| 5,657,019 A | * | 8/1997 | Hunt et al. | 341/120 |
| 5,726,676 A | | 3/1998 | Callahan, Jr. et al. | 345/98 |
| 5,731,796 A | * | 3/1998 | Furuhashi et al. | 345/96 |
| 5,959,604 A | * | 9/1999 | Mosier | 345/100 |
| 5,999,158 A | * | 12/1999 | Sekido et al. | 345/98 |

OTHER PUBLICATIONS

Wiley Encyclopedia of Electrical and Electronics Engineering, J. G. Webster, 1999, Wiley, vol. 5, p. 518–519.*

* cited by examiner

Primary Examiner—Jeffery Brier
Assistant Examiner—Ryan Yang
(74) Attorney, Agent, or Firm—Myers Bigel Sibley & Sajovec

(57) ABSTRACT

A decoding system includes a plurality of decoders, a respective one of which is responsive to respective multibit input data, to decode the respective multibit input data and produce a respective output level corresponding to the respective multibit input data. The same multibit input data is simultaneously applied to the plurality of decoders, in response to a test mode signal. Different multibit input data is then simultaneously applied to the plurality of decoders, so that all of the output levels of the decoders can be tested. The output levels from the plurality of decoders that result from the same multibit input data that is supplied to the plurality of decoders is detected. The detected output levels from the plurality of decoders that result from the same multibit input data that is applied to the plurality of decoders is compared to expected output levels in order to test the decoders.

27 Claims, 7 Drawing Sheets

DECODER TESTING APPARATUS AND METHODS THAT SIMULTANEOUSLY APPLY THE SAME MULTIBIT INPUT DATA TO MULTIPLE DECODERS

FIELD OF THE INVENTION

This invention relates to decoders such as are used to drive the pixels of a display, and more particularly to testing of decoders.

BACKGROUND OF THE INVENTION

Decoders are widely used in displays, such as Liquid Crystal Displays (LCDs). As is well known to those having skill in the art, in an LCD, a source driver for a thin film transistor (TFT) drives the thin film transistor with an output voltage that corresponds to data for displaying the brightness of the red (R), green (G) and blue (B) portions of a given pixel. In one example, 300 decoders may be present, each of which is responsive to one of 64 contrast levels, to produce a respective output level corresponding to the selected contrast level. The 64 contrast levels may be provided using six bits of multibit input data, to provide a selected voltage V1–V64 corresponding to 64 output levels.

In view of the large numbers of decoders and the large numbers of output levels that each decoder can provide, testing of the decoders may be extremely time consuming. More specifically, in conventional test programs, the output of each decoder is cycled through each of the output levels. Thus, if 300 decoders are present, each of which provides an output voltage level V1–V64 in response to six bits of input data, 65 cycles may be needed to test all of the output voltage levels. Each cycle may use at least 100 shift clocks and one latch clock. Accordingly, the time for testing the decoders can be unacceptably long.

FIGS. 1(a)–1(f) are conventional timing diagrams for conventional decoder testing. Input data for a plurality of channels is serially latched into a data register in response to a shift clock (SCLK) shown in FIG. 1(a). All the data latched to the data register is simultaneously output in response to a latch clock (LCLK) shown in FIG. 1(b). A conventional test for decoders may use 100 shift clocks since input data with respect to R, G and B are input at one time in response to one clock of the shift clock (SCLK).

FIG. 1(c) shows input data which has the same value. Real input data is separate data; however, data having the same value are used for a test. FIGS. 1(d) through 1(f) show the outputs of output channels OUT1 through OUT300, which are output at one time in response to the latch clock (LCLK). As shown, times of 64 contrast levels×100 shift clocks may be needed if such outputs are performed with respect to 64 contrast levels.

As a result, a testing time of at least the number of contrast levels times the period of shift clock times the number of outputs may be needed for testing the decoders. Since more than five types of tests may be performed in order to test a decoder in an integrated circuit, most of the test time for the integrated circuit may be consumed on testing the decoders.

SUMMARY OF THE INVENTION

It is therefore an object of the present invention to provide improved decoders and decoder testing methods.

It is another object of the present invention to provide decoders and decoder testing methods that can reduce the amount of time that is used to test the decoders.

These and other objects are provided according to the present invention, by simultaneously applying the same multibit input data to a plurality of decoders in response to a test mode signal. It has been found, according to the invention, that since all of the decoders are being tested, the same data may be input to all of the decoders without inputting separate data through the decoder input terminals, as is the case during normal decoding operations. Accordingly, the time for testing the decoders can be reduced.

More specifically, according to the invention, a decoding system includes a plurality of decoders, a respective one of which is responsive to respective multibit input data, to decode the respective multibit input data and produce a respective output level corresponding to the respective multibit input data. Means and methods are provided for simultaneously applying the same multibit input data to the plurality of decoders, in response to a test mode signal. Different multibit input data is then simultaneously applied to the plurality of decoders, so that all of the output levels of the decoders can be tested. The output levels from the plurality of decoders that result from the same multibit input data that is supplied to the plurality of decoders is detected. The detected output levels from the plurality of decoders that result from the same multibit input data that is applied to the plurality of decoders is compared to expected output levels in order to test the decoders. The multibit input data preferably is N-bit input data, so that one of $2^N$ combinations of the N-bits is simultaneously applied to the plurality of decoders in response to the test mode signal.

In a preferred embodiment, the plurality of decoders comprises a plurality of red, green and blue signal decoders for a color display. The same first multibit input data is simultaneously applied to the plurality of red decoders, the same second multibit input data is simultaneously applied to the plurality of green decoders, and the same third multibit input data is simultaneously applied to the plurality of blue decoders, in response to the test mode signal.

The same multibit input data is preferably simultaneously applied to the plurality of decoders by providing a plurality of data registers that latch the same multibit input data therein and that simultaneously apply the latched multibit input data to the plurality of decoders. A controller produces a shift clock and a latch clock in response to the test mode signal. A shift register is responsive to the shift clock to generate a plurality of input control clocks. The plurality of data registers are responsive to the plurality of input control clocks, to latch the same multibit input data therein. The data registers are responsive to the latch clock, to simultaneously apply the latched multibit input data to the plurality of decoders.

Accordingly, improved decoders and testing apparatus and methods for decoders are provided that can reduce the testing time for the decoders.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
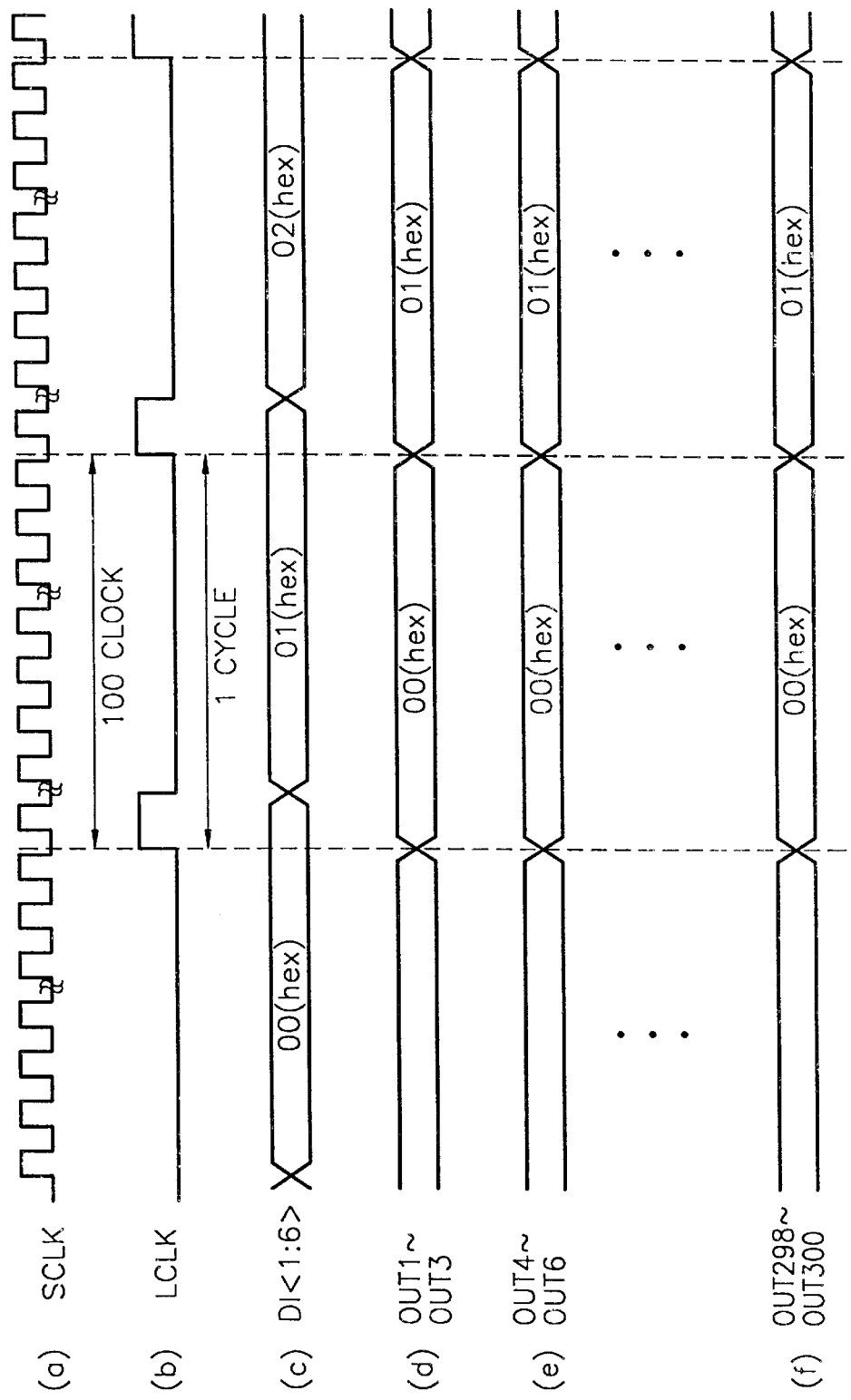
FIGS. 1(a) through 1(f) are conventional timing diagrams for testing decoders.
Figure 2:
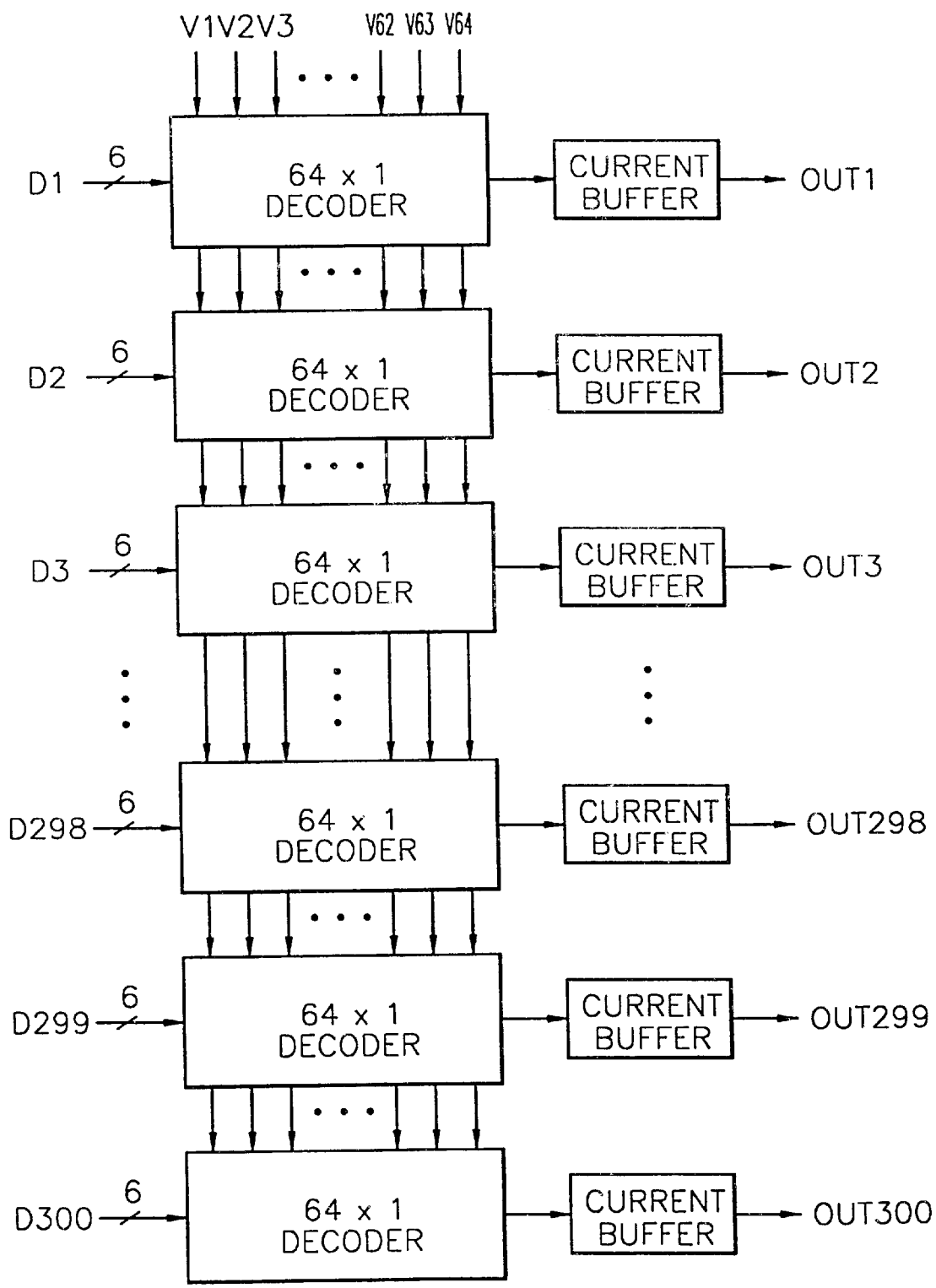
FIG. 2 is a schematic block diagram of an output portion in an embodiment of a Liquid Crystal Display (LCD) source driver according to the present invention.

FIG. 2 is a schematic block diagram of an output portion of a Liquid Crystal Display (LCD) source driver according to the present invention. Decoders select contrast levels of the output portion of the 64 contrast levels, and 300 channel drivers select a voltage of a level corresponding to input data among voltages V1 through V64 corresponding to all the bit combinations of six bit input data.

Each of input data D1 through D300 is separate data corresponding respectively to 300 channels OUT1 through OUT300. Three channels are used for R, G, and B display voltages of a pixel. In order to simultaneously output voltage for display on all the pixels in a TFT panel, input data with respect to the respective channels are serially latched to a data register in response to a shift clock before it is input to the respective decoders.

The data register input data with respect to three channels is shifted in response to a shift clock in order to display the degrees of brightness of R, G, and B for a pixel in an LCD panel. Therefore, at least 100 shift clocks may be needed for storing input data for 300 channels in the data register. All the input data latched to the data register are simultaneously output to the respective decoders in response to a latch clock. The respective decoders select voltages corresponding to the input data, from the voltages V1 through V64 of levels corresponding to all the bit combinations of the input data. The display voltages are output to the respective channels OUT1 through OUT300 through the respective current buffers.

Figure 3:
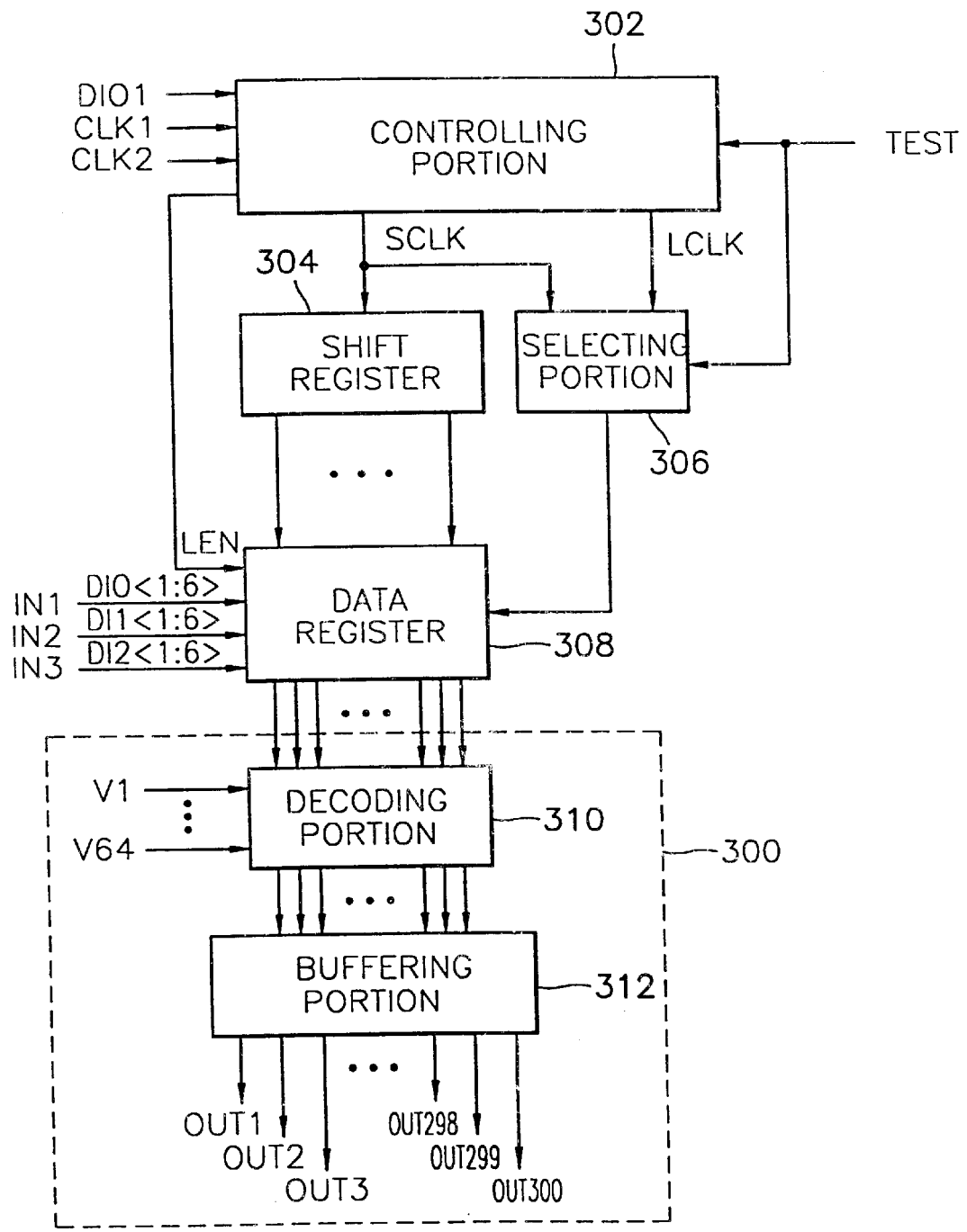
FIG. 3 is a block diagram showing a preferred embodiment of decoder test controlling apparatus and methods according to the present invention.

FIG. 3 is a block diagram showing a preferred embodiment of decoder test controlling apparatus and methods according to the present invention, and also includes a schematic block diagram of FIG. 2. Referring to FIG. 3, decoder test controlling apparatus and methods according to the present invention include a controlling portion 302, a shift register 304, a selecting portion 306, a data register 308, and an output portion 300. The output portion 300 includes a decoding portion 310 and a buffering portion 312. The decoding portion 310 includes a plurality of decoders as shown in FIG. 2. The buffering portion 312 includes a plurality of buffers as shown in FIG. 2.

The decoding portion 310 is applied to 64 contrast levels and 300 channel source drivers having three input data DI0–DI2 which are respectively formed of 6 bits and 300 output channels OUT1 through OUT300, in order to select the contrast levels of R, G, and B with respect to 100 respective pixels of a panel. However, it is well known to those of the art that such numbers are variable in different decoding systems and methods.

The controlling portion 302 generates a shift clock (SCLK) in response to a second clock (CLK2) after a start pulse DI01 is externally input, generates a latch clock (LCLK) in response to a first clock (CLK1) having a pulse when the second clock (CLK2) has 100 pulses, and generates a latch enable signal (LEN) in response to a test control signal (TEST).

The shift register 304 serially outputs the shift clocks (SCLK) that is serially input from the controlling portion 302 one by one via a plurality of output lines. For example, when three input data are simultaneously latched in response to a clock output from the shift register 304, the shift register 304 serially outputs first through 100th shift clocks through 100 output lines. The selecting portion 306 selectively outputs the shift clock (SCLK) and the latch clock (LCLK) that is input from the controlling portion 302, in response to the test control signal (TEST).

The data register 308 inputs data DI0 through DI2 via input terminals IN1 through IN3 and serially latches the data to corresponding memories in response to the corresponding 100th shift clocks which are a plurality of input controlling clocks from the shift register 304. Here, the data DI0 through DI2 is formed of six bits. The data register 308 stores the 100th input data in a corresponding memory in response to the 100th shift clock from the shift register 304 and simultaneously outputs all the serially latched data in response to the latch clock (LCLK) from the selecting portion 306. When the shift clock (SCLK) is generated 100 times in response to the second clock (CLK2), the latch clock (LCLK) is generated once in response to the first clock (CLK1).

The decoding portion 310 inputs the data simultaneously output from the data register 308 and selects the voltages corresponding to the respective data from among the voltages V1 through V64 of 64 contrast levels corresponding to all the bit combinations of the six-bit data. The buffering portion 312 simultaneously stores the voltages selected from the decoding portion 310 and respectively outputs them as LCD displaying voltages through the 300 channels. It will be understood that the decoding portion 310 and the buffering portion 312 include a plurality of decoders and buffers corresponding to the number of the data simultaneously input to the decoding portion 310 or the output channels, as shown by the decoders and buffers of FIG. 2.

The above-described operation of the data register 308 corresponds to the normal operation of the data register 308, in response to the latch clock (LCLK) from the selecting portion 306. Operation of the data register 308 when the decoding portion 310 is tested for a circuit verification in the LCD source driver for the TFT will now be described.

To verify the characteristics of the respective decoders of the decoding portion 310, the data to be input to the respective decoders should be changed to 64 types so that the voltages V1 through V64 of the levels of all the cases can be output from the respective decoders. However, since the respective decoders are being tested, the same data may be input to all the decoders through the input terminals IN1 through IN3, without inputting separate data to the decoders as shown in FIG. 2.

When the test control signal TEST is applied to the above-mentioned controlling portion 302 and the selecting portion 306, the data register 308 receives the latch enable signal LEN and the shift clock SCLK respectively from the controlling portion 302 and the selecting portion 306. The data register 308 latches data input once through the input terminals IN1 through IN3 to all the memories in response to the latch enable signal LEN. The data register 308 outputs the latched data to all the decoders of the decoding portion 310 in response to the shift clock SCLK whenever it receives a first, second, . . . , or 100th shift clock from the shift register 304. Therefore, the data register 308 can output all the bit combinations of the data input through the input terminals IN1 through IN3 to all the decoders of the decoding portion 310 while 64 shift clocks SCLK are generated. Consequently, the data register 308 can reduce test time by latching input data simultaneously to all the memories and outputting the data to all the decoders of the decoding portion 310.

Figure 4:
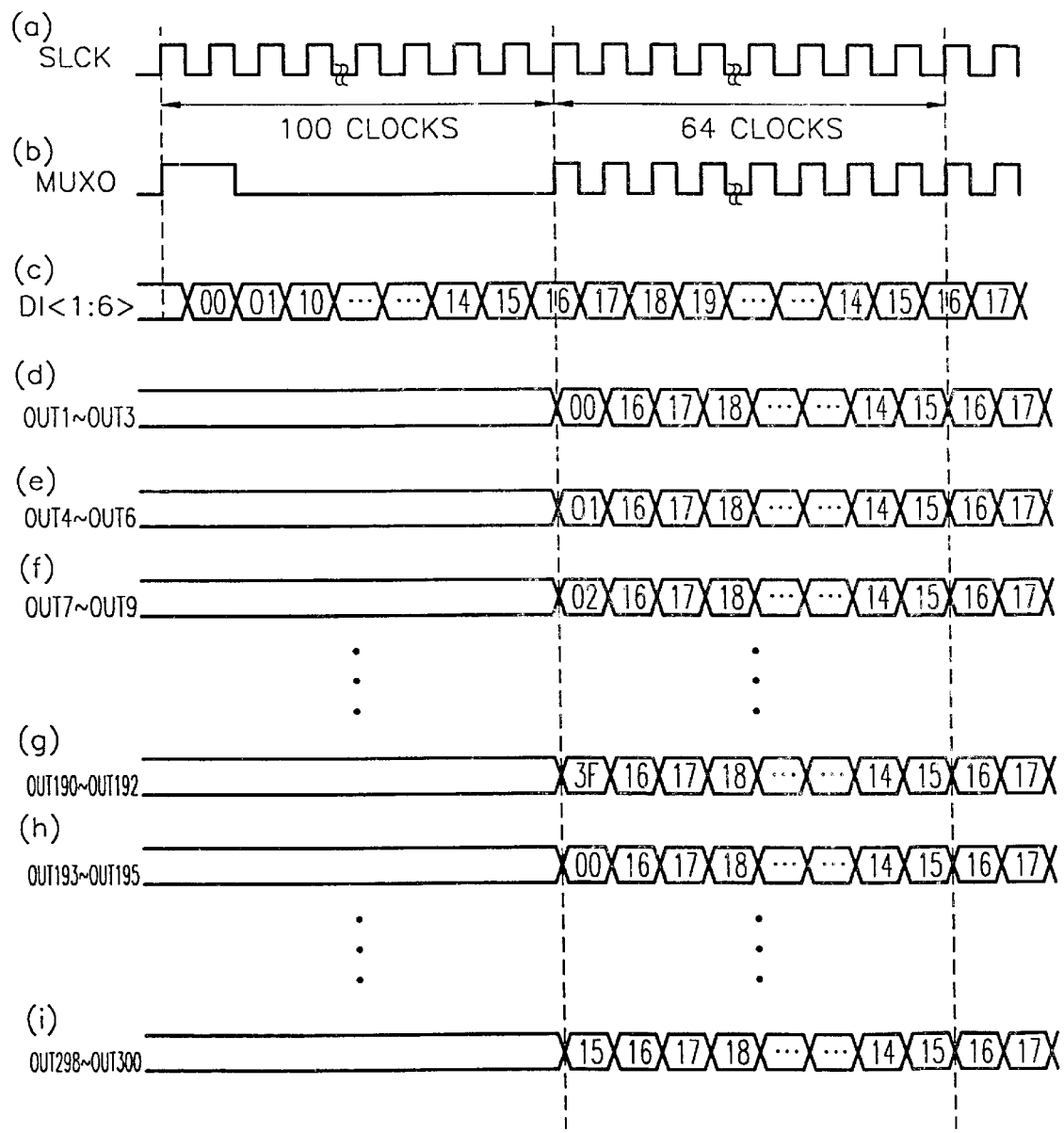
FIGS. 4(a) through 4(i) are timing diagrams for testing a decoder shown in FIG. 3.

FIGS. 4(a) through 4(i) are timing diagrams for testing the decoding portion shown in FIG. 3. Assuming that a point of time in which a clock after 100 clocks is first generated from the shift clock SCLK shown in FIG. 4(a) is a test mode, 64 clocks after the first 100 clocks are output from the shift register 304 and the selecting portion 306. Thus, the output MUXO of the selecting portion 306 shown in FIG. 4(b) is the latch clock LCLK during the first cycle and the shift clock SCLK during the next cycles.

The data DI shown in FIG. 4(c) is serially latched in response to first 100 clocks and is simultaneously output. DI denotes the input data of the data register 308. However, since the output MUXO of the selecting portion 306 is converted into the shift clock SCLK, the data DI shown in FIG. 4(c) is continuously output as shown in FIGS. 4(c) and 4(h) in response to the next 64 clocks. The data DI is not serially latched but is directly output since the shift clock SCLK is used instead of the latch clock LCLK during the test operation.

Figure 5:
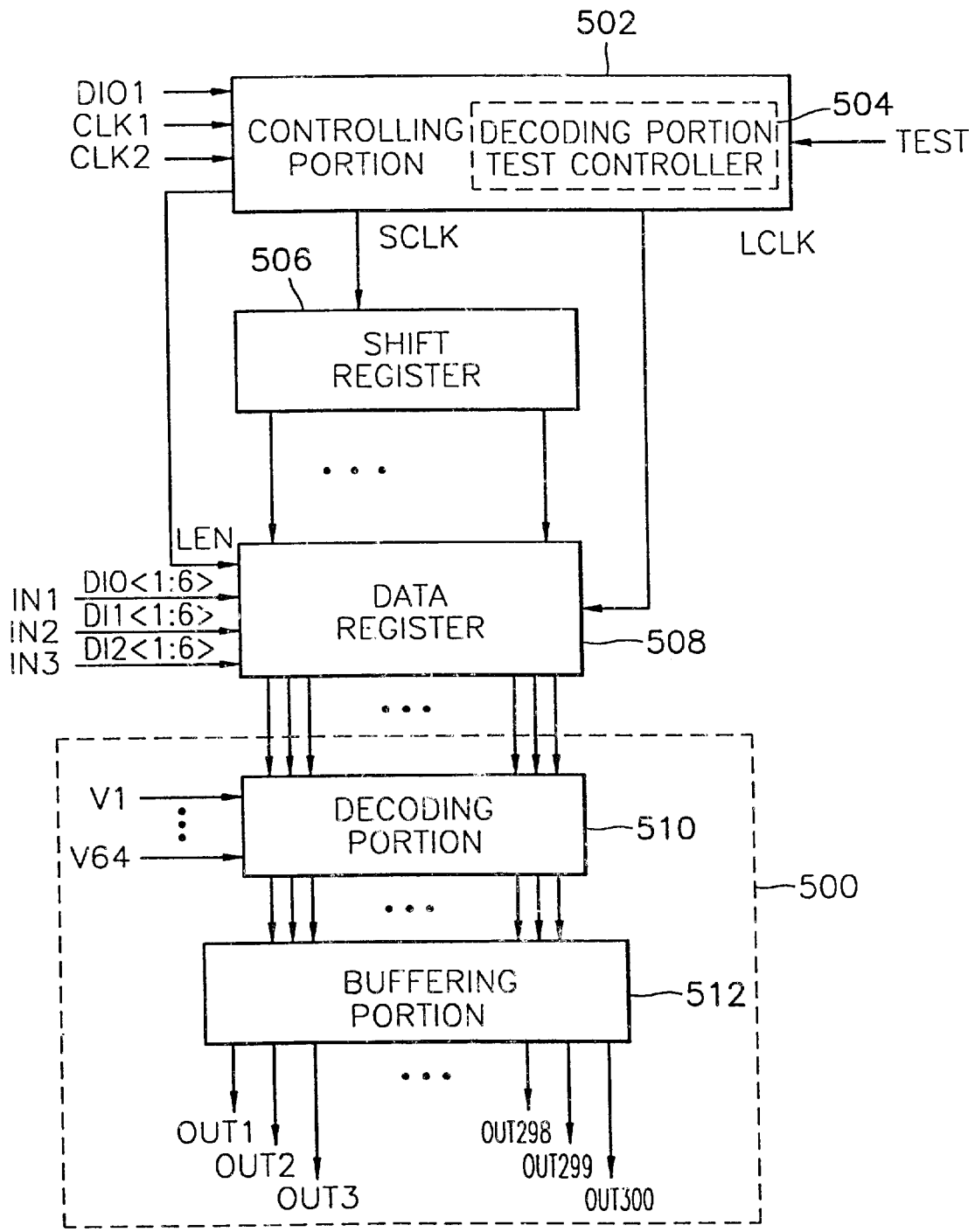
FIG. 5 is a block diagram showing another preferred embodiment of decoder test controlling apparatus and methods according to the present invention.

FIG. 5 is a block diagram showing another preferred embodiment of decoder test controlling apparatus and methods according to the present invention, and also includes a schematic block diagram of FIG. 2. Referring to FIG. 5, decoder test controlling apparatus and methods according to the present invention include a controlling portion 502, a shift register 506, a data register 508, and an output portion 500. The output portion 500 includes a decoding portion 510 and a buffering portion 512. The decoding portion 510 includes a plurality of decoders as shown in FIG. 2. The buffering portion 512 includes a plurality of buffers as shown in FIG. 2.

The decoding portion 510 is applied to the 64 contrast levels and 300 channel source drivers like the decoding portion 310 shown in FIG. 3. However, as described above, the numbers are variable in different decoding systems and methods.

The controlling portion 502 generates the shift clock SCLK in response to the second clock CLK2 after external input of the start pulse DI01, and generates the latch clock LCLK in response to the first clock CLK1 having a pulse when the second clock CLK2 has 100 pulses. However, when the test control signal TEST is applied to the decoding portion test controller 504 of the controlling portion 502, the controlling portion 502 generates the latch clock LCLK and the latch enable signal LEN maintaining a high level, i.e., an output enable level, in response to test control signal TEST.

The shift register 506 serially outputs the shift clocks SCLK that were serially input from the controlling portion 502 through a plurality of output lines. For example, if three input data are simultaneously latched in response to a clock output from the shift register 506, 100 shift clocks may be used with respect to 300 output channels. Accordingly, the shift register 506 serially outputs first through 100th shift clock through 100 output lines.

The data register 508 continuously inputs six bit data DI0 through DI2 through the input terminals IN1 through IN3 and serially latches the input data to corresponding memories in response to the first through 100 shift clocks which are a plurality of input control clocks output from the shift register 506. The data register 508 simultaneously outputs the serially latched data in response to the latch clock LCLK generated from the controlling portion 502 in response to the first clock CLK1. When the shift clock SCLK is generated 100 times in response to the second clock CLK2, the latch clock LCLK is generated once in response to the first clock CLK1.

The decoding portion 510 and the buffering portion 512 operate in a manner corresponding to the decoding portion 310 and the buffering portion 312 shown in FIG. 3, respectively. The decoding portion 510 inputs data that is simultaneously output from the data register 508 and selects voltages corresponding to the respective data among the voltages V1 through V64 of 64 levels corresponding to all the bit combinations of the six bit data. The buffering portion 512 temporarily stores the voltages selected from the decoding portion 510 and outputs them as panel displaying voltages through the 300 channels.

The above-described operation of the data register 508 corresponds to normal operation of the apparatus for providing panel displaying voltages, in response to the latch clock LCLK generated from the controlling portion 502 in response to the first clock CLK1. Operation of the data register 508 when the decoding portion 510 is tested for a circuit verification in the apparatus for providing panel displaying voltages will now be described.

As mentioned above, the controlling portion 502 generates the latch clock LCLK in response to the first clock CLK1 during a normal operation. However, when the test control signal TEST is applied to the decoding portion test controller 504 of the controlling portion 502, the controlling portion 502 generates the latch clock LCLK maintaining a high level and the latch enable signal LEN in response to the test control signal TEST.

The data register 508 latches the data which is input once through the input terminals IN1 through IN3 to all the memories in response to the latch enable signal LEN. The data register 508 outputs the data to all the decoders of the decoding portion 510 in response to the latch clock LCLK which is always a high level, whenever a first, second, . . . , or 100th shift clock among the plurality of input control clocks is received from the shift register 506. Therefore, the data register 508 can output all the bit combinations of the data input through the input terminals IN1 through IN3 to all the decoders of the decoding portion 510 while the 64 shift clocks SCLK are generated. Consequently, the data register 508 can reduce the test time by latching data input simultaneously to all the memories and outputting the data to all the decoders of the decoding portion 510.

Figure 6:
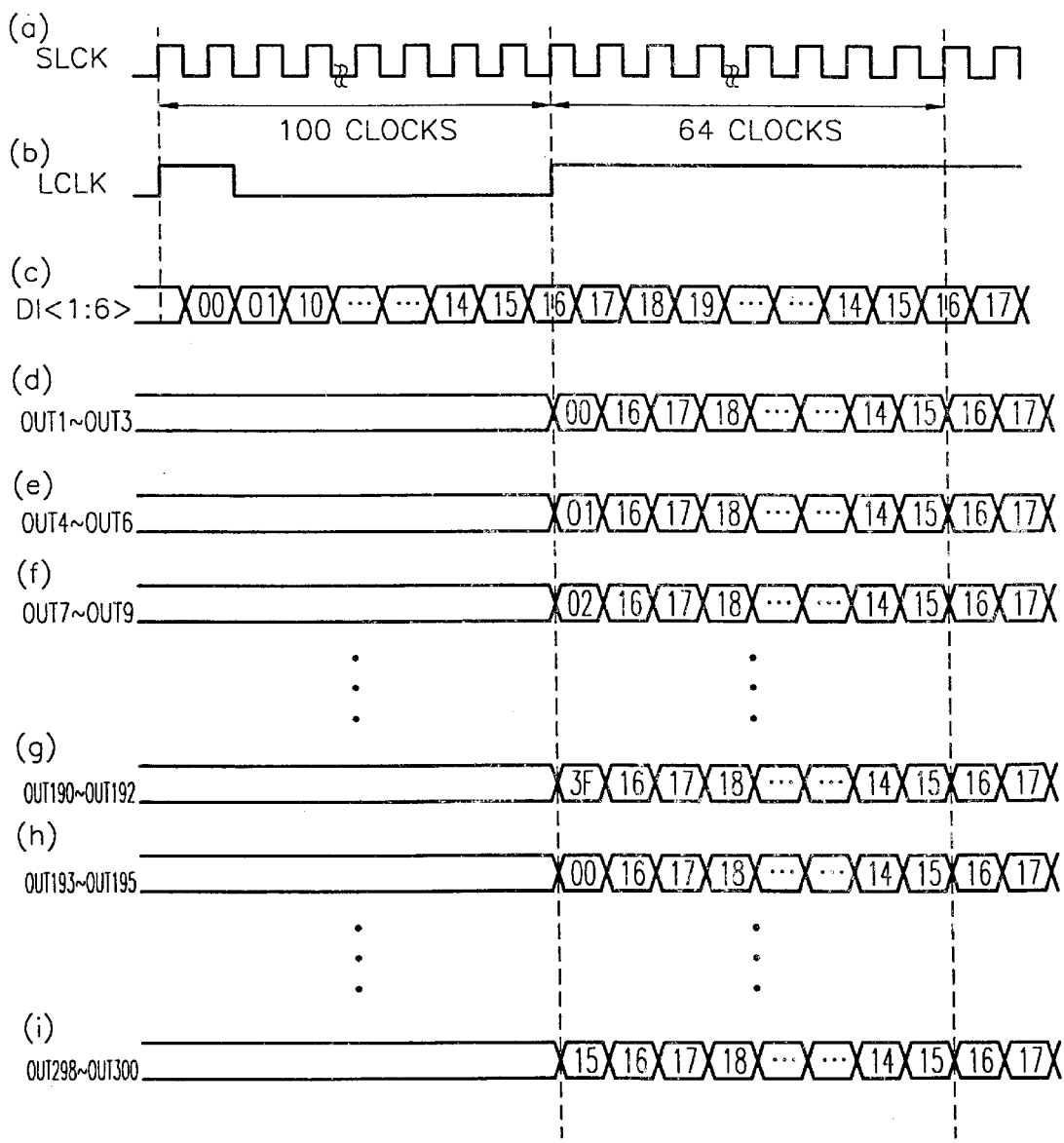
FIGS. 6(a) through 6(i) are timing diagrams for testing a decoder shown in FIG. 5.

FIGS. 6(a) through 6(i) are timing diagrams for testing the decoding portion shown in FIG. 5. Assume that a point of time in which clocks after first 100 clocks are generated from the shift clock SCLK shown in FIG. 6(a) is a test mode. Then, the latch clock LCLK shown in of FIG. 6(b) maintains a high level, i.e., an output enable level during the test mode.

Data DI shown in FIG. 6(c) is simultaneously output in response to the latch clock LCLK after it is serially latched in response to the first 100 clocks. DI representatively denotes the input data of the data register 508. However, since the latch clock LCLK continuously maintains the high level, the data DI shown in FIG. 6(c) is continuously output as shown in FIGS. 6(d) through (i) in response to the next 64 clocks. Namely, since the latch clock LCLK maintains a high level during the test operation, the data DI is not serially latched but is directly output.

Therefore, the time needed for testing the decoding portion of the apparatus for supplying panel displaying voltages according to the present invention can be reduced to about 2/64 for a decoder for 64 contrast levels and to 2/256 for a decoder for 256 contrast levels compared with the test time in FIGS. 1(a) through (f).

Figure 7:
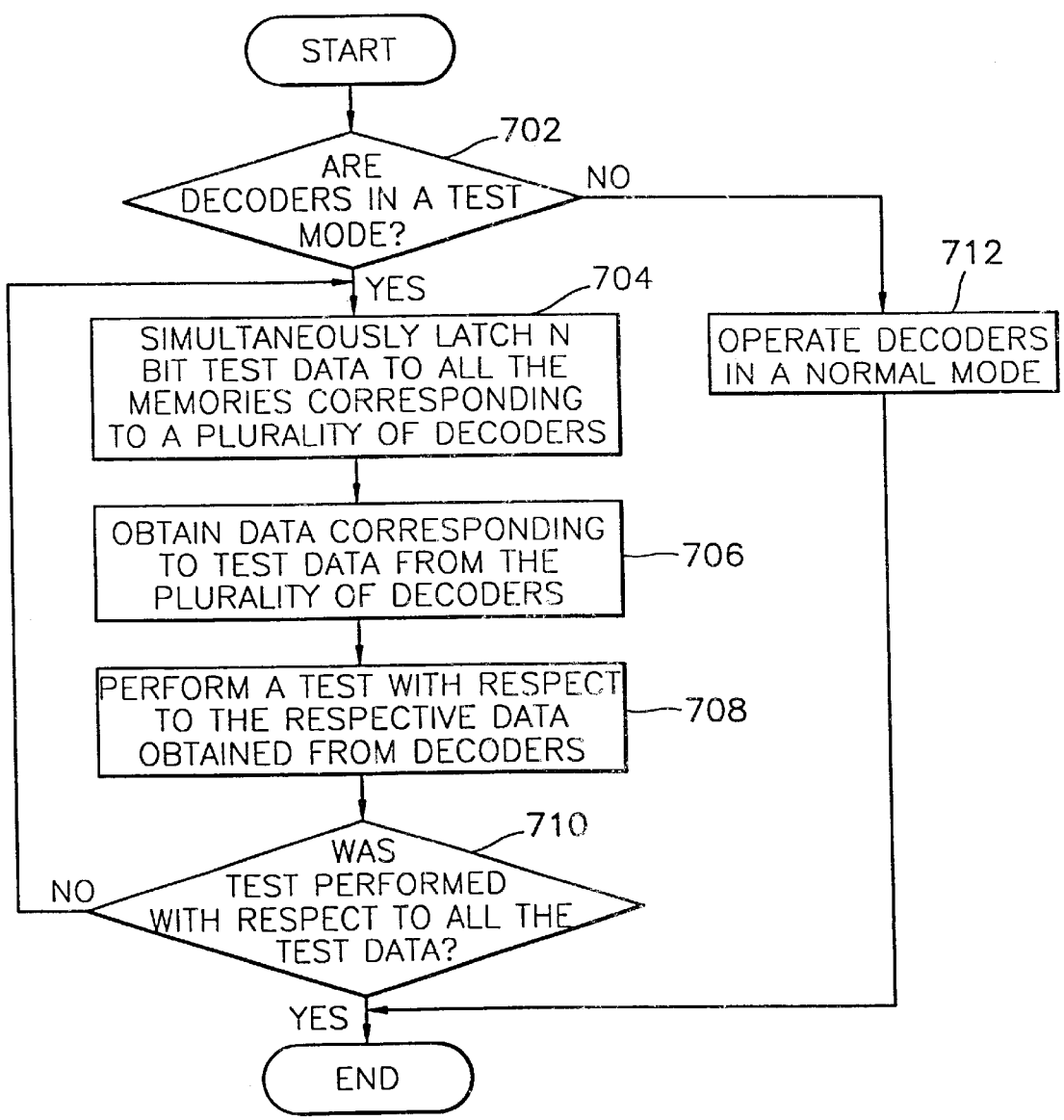
FIG. 7 is a flow chart showing decoder testing methods according to the present invention.

A decoder testing method according to the present invention will be described with reference to FIG. 7. FIG. 7 is a flowchart showing a decoder testing method according to the present invention.

Referring to FIG. 7, it is determined whether the decoders are in a testing mode (Step 702). If not, the decoders operate in a normal mode (Step 712). The decoders for selecting contrast levels used in the LCD source driver respectively select one among $2^N$ outputs, i.e., the voltages of the levels corresponding to the respective input data, with respect to the respective N-bit data for displaying the degrees of the brightness of colors with respect to the respective pixels of the panel. During the normal mode, the respective N bit data is serially latched to the memories corresponding to the respective decoders and is simultaneously output to the decoders. Accordingly, the outputs of the respective decoders are simultaneously obtained as panel displaying voltages.

However, when the decoders are determined to be in the test mode in step 702, N bit input data corresponding to one among all the $2^N$ bit combinations of the N bit data is selected as test data and is simultaneously latched to all the memories corresponding to the respective decoders (Step 704). After Step 704, the latched test data is output to all the decoders and the data corresponding to the test data is obtained from the plurality of decoders (Step 706). After Step 706, predetermined comparison tests are performed with respect to the data obtained from the plurality of decoders (Step 708). Also, it is determined whether tests were performed with respect to all the test data (Step 710). If not, the test processes are repeatedly performed.

According to a decoder testing method of the present invention shown in FIG. 7, during the test mode, the N bit data are not serially input and latched to the memories corresponding to the plurality of decoders. Also, the clocks for outputting the test data to all the decoders in the Step 706 have the same timing as that of the clocks used for latching the test data to the memories in the Step 704 or to maintain an output enable level during the test mode of the decoders.

Therefore, it is possible to reduce the time for serially latching the N bit data compared with a normal mode. For example, the time for obtaining $2^N$ outputs corresponding to the test data formed of $2^N$ clock time bit combinations from the M decoders is generally L+$2^N$ clock time. Here, L is the value obtained by dividing the number of output channels connected to the M decoders by 3, since the N bit data corresponding to the R, G, and B are simultaneously latched. Accordingly, decoder test controlling apparatus and methods according to the present invention can reduce the time for testing the decoders by controlling the output of the data register for latching the data to be decoded in the front ends of the decoders for selecting contrast levels.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of testing a plurality of decoders, a respective one of which is responsive to respective multibit input data, to decode the respective multibit input data and select one of a plurality of input voltage levels to produce a respective output level selected from the plurality of input voltage levels corresponding to the respective multibit input data, the testing method comprising the step of:

simultaneously applying the same multibit input data to the plurality of decoders, to thereby cause the plurality of decoders to each select an identical one of the plurality of input voltage levels, in response to a test mode signal.

2. A method according to claim 1 wherein the step of simultaneously applying is repeatedly performed with different multibit input data, in response to the test mode signal.

3. A method according to claim 1 wherein the step of simultaneously applying is followed by the steps of:

detecting the output levels from the plurality of decoders that result from the same multibit input data that is simultaneously applied to the plurality of decoders; and comparing the detected output levels from the plurality of decoders that result from the same multibit input data that is simultaneously applied to the plurality of decoders, to expected output levels.

4. A method according to claim 1 wherein the multibit input data is N bit input data, and wherein the simultaneously applying step comprises the step of:

simultaneously applying one of $2^N$ combinations of the N bits to the plurality of decoders, in response to a test mode signal.

5. A method according to claim 1 wherein the plurality of decoders comprises a plurality of red, green and blue signal decoders for a color display, the simultaneously applying step comprising the steps of:

simultaneously applying the same first multibit input data to the plurality of red decoders;

simultaneously applying the same second multibit input data to the plurality of green decoders; and simultaneously applying the same third multibit input data to the plurality of blue decoders, in response to the test mode signal.

6. Apparatus for testing a plurality of decoders, a respective one of which is responsive to respective multibit input data, to decode the respective multibit input data and select one of a plurality of input voltage levels to produce a respective output level selected from the plurality of input voltage levels corresponding to the respective multibit input data, the testing apparatus comprising:

means for simultaneously applying the same multibit input data to the plurality of decoders, to thereby cause the plurality of decoders to each select an identical one of the plurality of input voltage levels, in response to a test mode signal.

7. Apparatus according to claim 6 wherein the simultaneously applying means comprises means for repeatedly simultaneously applying the same multibit input data to the plurality of decoders, in response to a test mode signal.

8. Apparatus according to claim 6 further comprising:

means for detecting the output levels from the plurality of decoders that result from the same multibit input data that is simultaneously applied to the plurality of decoders; and means for comparing the detected output levels from the plurality of decoders that result from the same multibit input data that is simultaneously applied to the plurality of decoders, to expected output levels.

9. Apparatus according to claim 6 wherein the multibit input data is N bit input data, and wherein the simultaneously applying means comprises:
   means for simultaneously applying one of $2^N$ combinations of the N bits to the plurality of decoders, in response to a test mode signal.

10. Apparatus according to claim 6 wherein the plurality of decoders comprises a plurality of red, green and blue signal decoders for a color display, the simultaneously applying means comprising:
   means for simultaneously applying the same first multibit input data to the plurality of red decoders;
   means for simultaneously applying the same second multibit input data to the plurality of green decoders; and
   means for simultaneously applying the same third multibit input data to the plurality of blue decoders, in response to the test mode signal.

11. Apparatus according to claim 6 wherein the simultaneously applying means comprises:
   a plurality of data registers that latch the same multibit input data therein and that simultaneously apply the latched multibit input data to the plurality of decoders.

12. Apparatus according to claim 11 further comprising:
   a controller that produces a shift clock and a latch clock in response to the test mode signal;
   a shift register that is responsive to the shift clock to generate a plurality of input control clocks;
   the plurality of data registers being responsive to the plurality of input control clocks to latch the same multibit input data therein; and
   the plurality of data registers being responsive to the latch clock to simultaneously apply the latched multibit input data to the plurality of decoders.

13. A decoding system comprising:
   a plurality of decoders, a respective one of which is responsive to respective multibit input data, to decode the respective multibit input data and select one of a plurality of input voltage levels to produce a respective output level selected from the plurality of input voltage levels corresponding to the respective multibit input data; and
   means for simultaneously applying the same multibit input data to the plurality of decoders, to thereby cause the plurality of decoders to each select an identical one of the plurality of input voltage levels, in response to a test mode signal.

14. A decoding system according to claim 13 wherein the simultaneously applying means comprises means for repeatedly simultaneously applying the same multibit input data to the plurality of decoders, in response to a test mode signal.

15. A decoding system according to claim 13 further comprising:
   means for detecting the output levels from the plurality of decoders that result from the same multibit input data that is simultaneously applied to the plurality of decoders; and
   means for comparing the detected output levels from the plurality of decoders that result from the same multibit input data that is simultaneously applied to the plurality of decoders, to expected output levels.

16. A decoding system according to claim 13 wherein the multibit input data is N bit input data, and wherein the simultaneously applying means comprises:
   means for simultaneously applying one of $2^N$ combinations of the N bits to the plurality of decoders, in response to a test mode signal.

17. A decoding system according to claim 13 wherein the plurality of decoders comprises a plurality of red, green and blue signal decoders for a color display, the simultaneously applying means comprising:
   means for simultaneously applying the same first multibit input data to the plurality of red decoders;
   means for simultaneously applying the same second multibit input data to the plurality of green decoders; and
   means for simultaneously applying the same third multibit input data to the plurality of blue decoders, in response to the test mode signal.

18. A decoding system according to claim 13 wherein the simultaneously applying means comprises:
   a plurality of data registers that latch the same multibit input data therein and that simultaneously apply the latched multibit input data to the plurality of decoders.

19. A decoding system according to claim 18 further comprising:
   a controller that produces a shift clock and a latch clock in response to the test mode signal;
   a shift register that is responsive to the shift clock to generate a plurality of input control clocks;
   the plurality of data registers being responsive to the plurality of input control clocks to latch the same multibit input data therein; and
   the plurality of data registers being responsive to the latch clock to simultaneously apply the latched multibit input data to the plurality of decoders.

20. Apparatus for testing a plurality of decoders, a respective one of which is responsive to respective multibit input data, to decode the respective multibit input data and select one of a plurality of input voltage levels to produce a respective output level selected from the plurality of input voltage levels corresponding to the respective multibit input data, the testing apparatus comprising:
   a circuit that simultaneously applies the same multibit input data to the plurality of decoders, to thereby cause the plurality of decoders to each select an identical one of the plurality of input voltage levels, in response to a test mode signal.

21. Apparatus according to claim 20 wherein the simultaneously applying circuit comprises a circuit that repeatedly simultaneously applies the same multibit input data to the plurality of decoders, in response to a test mode signal.

22. Apparatus according to claim 20 further comprising:
   a first circuit that detects the output levels from the plurality of decoders that result from the same multibit input data that is simultaneously applied to the plurality of decoders; and
   a second circuit that compares the detected output levels from the plurality of decoders that result from the same multibit input data that is simultaneously applied to the plurality of decoders, to expected output levels.

23. Apparatus according to claim 20 wherein the multibit input data is N bit input data, and wherein the simultaneously applying circuit comprises:
   a circuit that simultaneously applies one of $2^N$ combinations of the N bits to the plurality of decoders, in response to a test mode signal.

24. A decoding system comprising:
   a plurality of decoders, a respective one of which is responsive to respective multibit input data, to decode the respective multibit input data and select one of a plurality of input voltage levels to produce a respective output level selected from the plurality of input voltage levels corresponding to the respective multibit input data; and a circuit that simultaneously applies the same multibit input data to the plurality of decoders, to thereby cause the plurality of decoders to each select an identical one of the plurality of input voltage levels, in response to a test mode signal.

25. A decoding system according to claim 24 wherein the simultaneously applying circuit comprises a circuit that repeatedly simultaneously applies the same multibit input data to the plurality of decoders, in response to a test mode signal.

26. A decoding system according to claim 24 further comprising:

a first circuit that detects the output levels from the plurality of decoders that result from the same multibit input data that is simultaneously applied to the plurality of decoders; and a second circuit that compares the detected output levels from the plurality of decoders that result from the same multibit input data that is simultaneously applied to the plurality of decoders, to expected output levels.

27. A decoding system according to claim 24 wherein the multibit input data is N bit input data, and wherein the simultaneously applying circuit comprises:

a circuit that simultaneously applies one of $2^N$ combinations of the N bits to the plurality of decoders, in response to a test mode signal.

* * * * *